US006525352B1

(12) United States Patent
Muller et al.

(10) Patent No.: US 6,525,352 B1
(45) Date of Patent: Feb. 25, 2003

(54) METHOD TO REDUCE RELEASE TIME OF MICROMACHINED DEVICES

(75) Inventors: Lilac Muller, Boulder, CO (US); Bevan Staple, Longmont, CO (US)

(73) Assignee: Network Photonics, Inc., Boulder, CO (US)

(*) Notice: Subject to any disclaimer, the term of this patent is extended or adjusted under 35 U.S.C. 154(b) by 0 days.

(21) Appl. No.: 09/837,362

(22) Filed: Apr. 18, 2001

Related U.S. Application Data

(60) Provisional application No. 60/252,784, filed on Nov. 22, 2000.

(51) Int. Cl.$^7$ ............................................... H01L 27/14
(52) U.S. Cl. ......................................... 257/252; 438/50
(58) Field of Search ............................ 257/252; 438/50

(56) References Cited

U.S. PATENT DOCUMENTS 6,276,205 B1 * 8/2001 McNie et al.

OTHER PUBLICATIONS

Ashruf, C.M.A. et al. "Galvanic porous silicon formation without external contacts", Sensors and Actuators 74, Jun. 1999, pp. 118–122.

Torcheux, L. et al. "Electrochemical Coupling Effects on the Corrosion of Silicon Samples in HF Solutions," J. Electrochem. Soc., vol. 142, No. 6, Jun. 1995, pp. 2037–2046.

Keller, Christopher Guild, "Microfabricated Silicon High Aspect Ratio Flexures for In–Plane Motion," dissertation submitted in the graduate division of the University of California, Berkeley, Fall 1998.

Muller, Lilac, "Gimballed Electrostatic Microactuators with Embedded Interconnects," dissertation submitted in the graduate division of the University of California, Berkeley, Springs 2000.

* cited by examiner

Primary Examiner—Fetsum Abraham
(74) Attorney, Agent, or Firm—Townsend and Townsend and Crew

(57) ABSTRACT

A method for fabricating a micromachined device with a fast release step is provided. A first undoped sacrificial layer is deposited on a structural layer. A doped sacrificial layer is deposited on the first undoped sacrificial layer. A second undoped sacrificial layer is deposited on the doped sacrificial layer to produce a layered structure. An etchant is then applied to the layered structure.

17 Claims, 2 Drawing Sheets

METHOD TO REDUCE RELEASE TIME OF MICROMACHINED DEVICES

CROSS REFERENCE TO RELATED APPLICATION

This application is a nonprovisional of and claims the priority of U.S. Prov. Pat. Appl. No. 60/252,784, filed Nov. 22, 2000, which is herein incorporated by reference in its entirety for all purposes.

BACKGROUND OF THE INVENTION

The present invention relates to micromachined devices. More particularly, the present invention relates to a method to reduce the release time of micromachined devices.

Common processing techniques that are used to sculpt micromechanical structures include bulk micromachining, surface micromachining, and high-aspect-ratio micromachining. Bulk micromachining is a technique applied to a variety of etching procedures that selectively remove material, typically with a chemical etchant whose etching properties are selected depending on the crystallographic structure of the bulk material. High-aspect-ratio micromachining is a technique allowing the fabrication of thick (usually greater than hundreds of microns and up to millimeters thick), precision, high-aspect-ratio microelectromechanical systems (MEMS) structures, i.e. structures with near-vertical sides.

In surface micromachining (SMM), alternating layers of structural, usually polysilicon, and sacrificial material, usually silicon dioxide, are deposited and etched to form the shape required. Surface micromachining enables the fabrication of free-form, complex and multicomponent integrated electromechanical structures, giving freedom to fabricate devices and systems without constraints on materials, geometry, assembly, and interconnections. That is the source for the richness and depth of MEMS applications that cut across so many areas.

Micromachined devices are constructed of structural and sacrificial layers. To make such devices operable, the sacrificial layers are removed. This removal step is referred to as a "release." The release of microdevices typically involves a chemical reaction. In surface micromachining and in high-aspect-ratio silicon-on-insulator (SOI) technologies, the sacrificial layer is generally silicon dioxide and the release involves use of hydrofluoric acid (HF). Long exposure to HF can result in problems to the structural layers. For example, it has been reported that HF attacks the grain boundaries of polycrystalline silicon, making this structural material weaker.

The techniques disclosed in the prior art directed towards improving on the release time present many drawbacks. Indeed, one prior-art technique involves the introduction of etch holes into the structural layers. These holes allow the etchant to undercut the structural layers more readily and hence reduce etch time. However, the introduction of etch holes into the structural layers reduces the surface area that can be available in applications such as the fabrication of a micromirror. The holes interfere with the optical surface, thus posing problem in some applications.

Another prior-art approach to reduce release time involves the use of highly doped sacrificial oxide layers. The doped oxide etches faster in hydrofluoric acid (HF) than undoped oxide and hence reduces the required release time to dissolve the sacrificial oxide film. However, in surface micromachining, the dopants in the sacrificial layer have a tendency to migrate into the structural layers during high-temperature processing steps. As a result, the dopant distribution in the structural layers is non-uniform causing an undesirable stress gradient leading to a warping of the mechanical structure. In silicon-on-insulator (SOI) technology a doped oxide film cannot be used as a sacrificial material because this technology requires bonding of two structural substrates. This bonding is best accomplished with undoped thermal oxide film having the required characteristics of being smoother and more uniform.

Therefore, it would be highly desirable to make the release step of as a short duration as possible without interfering with the chemical and physical properties of the structural layers.

SUMMARY OF THE INVENTION

The present invention solves the above and other problems in the prior art by reducing the duration of the etch process without sacrificing the electromechanical properties of the structural layers in the micromachined devices. According to the present invention a method for reducing the etch duration is disclosed. In the present invention, reducing the etch time involves the introduction of a fast etch path within slower-etching higher-quality sacrificial layers. Indeed, by burying the fast etch channel in the sacrificial layer the impact of this channel on the structural layers in the microdevice is negligible. Therefore, the sacrificial and structural layer can be engineered for optimal electromechanical performance without consideration for the release time.

In surface micromachining and silicon-on-insulator technologies, a fast etch path is, preferably, introduced by depositing the sacrificial layers in three sequential steps. The first step, preferably, involves the deposition of an undoped oxide film, such as but not limited to, tetraethylorthosilicate (TEOS), thermal oxide, low-temperature oxide (LTO), and plasma-enhanced chemical-vapor-deposition (PECVD) oxide. The second step, preferably, involves the deposition of a thin doped oxide layer, such as but not limited to, phosphosilicate glass (PSG), borosilicate glass (BSG), and borophosphosilicate glass (BPSG). Preferably, the thickness of this layer is only slightly higher than the size of the etchant molecule. Preferably, the etchant molecule is hydrofluoric acid (HF). Preferably, the third step involves a second deposition of the undoped film. Preferably, this undoped film is an oxide film. This undoped oxide film can either be selected from the same material of the first undoped film or from another oxide.

The undoped films essentially cap the doped layer and thus constrain the dopants to the center of the sacrificial sandwich. Therefore, the dopants are prevented from interacting with the structural layers, yet they provide a fast etch channel.

During the release step, the etchant quickly dissolves the center of the sacrificial film composed of the thin doped oxide layer, then proceeds to dissolve the rest of the sacrificial film. Hence, this method significantly reduces the over etch release time compared to a single undoped sacrificial layer, which is a slower-etching material.

The obtained micromachined device can be used as part of a mechanical or optical system. For instance, it can be incorporated as a part of a wavelength router.

The present invention not only provides a method for making a micromachined device, but further provides a method for reducing the release time of micromachined devices by using a novel technique for allowing a fast etching of the sacrificed without altering the structural layer of the micromachined device. Other features, objects and advantages of the invention will become apparent from the following description when read in conjunction with the accompanying drawings.

BRIEF DESCRIPTION OF THE DRAWINGS

In the figures, similar components and/or features may have the same reference label.

DESCRIPTION OF THE SPECIFIC EMBODIMENTS

Figure 1:
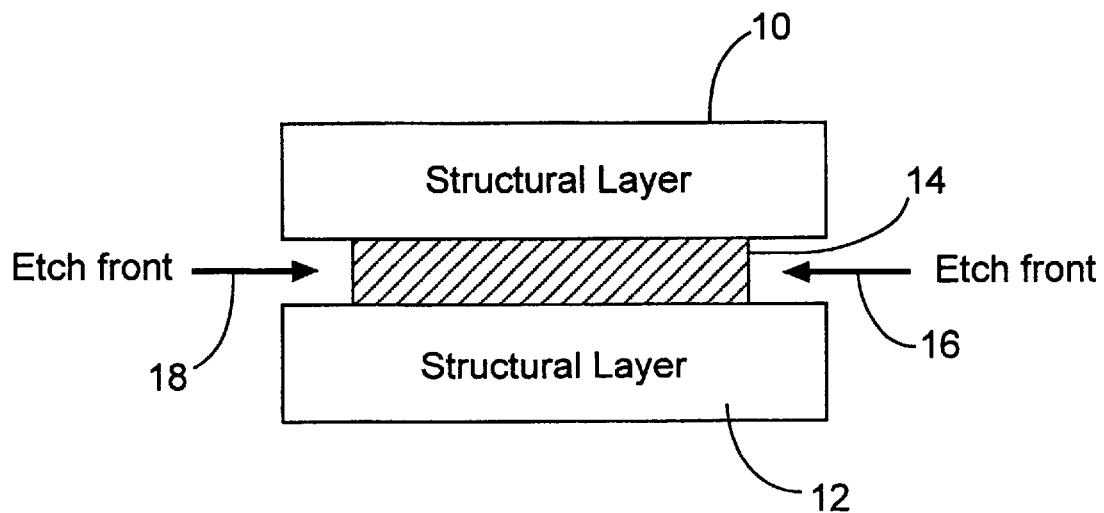
FIG. 1 is a schematic diagram illustrating the application of a release step as practiced in the prior art.

FIG. 1 illustrates a conventional method for applying the release step during the construction of a micromachined device. The simplified sandwich structure illustrated comprises two structural layers 10 and 12, and a sacrificial layer 14. It will be readily understood by a person skilled in the art that the illustrated principles described below are also applicable to more complex structures. To remove the sacrificial layer, which may, for example, be a doped or undoped oxide layer, an etchant such as HF is applied along etch fronts 16 and 18. The etchant acts to dissolve the sacrificial layer by acting on the surfaces of the sacrificial layer that are exposed in the sandwich structure.

Figure 2:
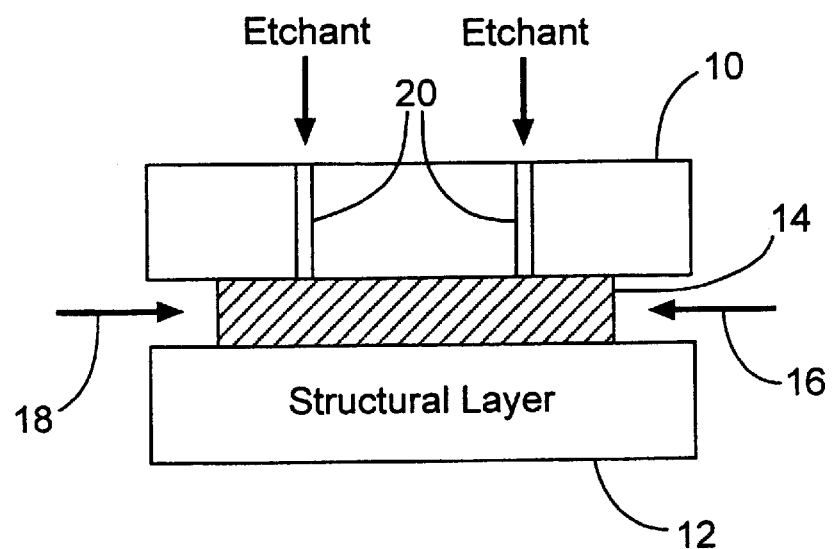
FIG. 2 is a schematic diagram illustrating the use of etch holes to improve release time.

One method of reducing release time is illustrated in FIG. 2 and involves the introduction of etch holes 20 into the structural layers of a device. In the illustration, etch holes 20 are shown in structural layer 10 although it is understood that they also may be formed in structural layer 12, either alternatively or in combination. The etch holes 20 allow the etchant to be applied to the sacrificial layer 14 by undercutting the structural layer 10 more readily and thereby reducing the overall etch time. However, in some applications, the introduction of etch holes into the structural layer 10 is undesirable because they may interfere with the intended function of that structural layer 10. For example, in applications where the structural layer is to be used as a micromirror, the etch holes are undesirable because they interfere with the optical surface.

Another approach that may be used to reduce release time involves the use of highly doped sacrificial oxide layers. The doped oxide etches faster in HF than does undoped oxide, thereby reducing the release time required to dissolve the sacrificial oxide layer 14. However, in surface micromachining, the dopants in the sacrificial layer tend to migrate into structural layers during high-temperature processing steps. As a result, the dopant distribution in the structural layers may be nonuniform, potentially causing an undesirable stress gradient, and hence a warping of the mechanical structure. Moreover, in SOI technology, a doped oxide film cannot generally be used as a sacrificial material because this technology requires the bonding of two structural substrates. This bonding is preferably accomplished with an undoped thermal oxide film which is smoother and more uniform.

According to embodiments of the invention, the etch time is reduced by introducing a fast etch path within a slow-etching, high-quality sacrificial layer. By burying the fast etch channel in the sacrificial layer, the structural impact of this channel on the microdevice is negligible. Thus, the sacrificial and structural layers may be engineered for optimal electromechanical performance without undue consideration for the release time.

Figure 3:
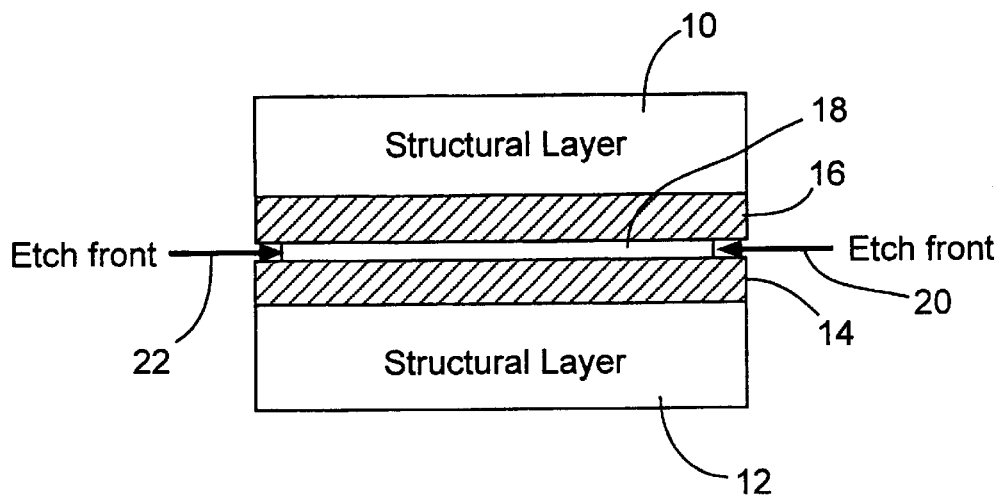
FIG. 3 is a schematic diagram illustrating the application of a release step according to one embodiment of the invention.

In one embodiment, suitable for surface micromachining and silicon-on-insulator or SOI applications, a fast etch path is introduced by depositing the sacrificial layer in three sequential steps. The structure formed by the steps in this embodiment is shown in FIG. 3. The first step comprises deposition of an undoped oxide film 14, such as tetraethylorthosilicate (TEOS), thermal oxide, low-temperature oxide (LTO), or plasma-enhanced chemical-vapor-deposition (PECVD) oxide, on a first structural layer 12. The second step comprises the deposition of a thin doped oxide layer 18 on the undoped oxide film 14. The thickness of this layer 18 may be only slightly greater than the size of the etchant molecule to be used. Examples of materials appropriate for the thin doped oxide layer 18 include, but not limited to, phosphosilicate glass (PSG), borosilicate glass (BSG), and borophosphosilicate glass (BPSG). The third step includes a second deposition of the undoped film 16 on the thin doped oxide layer 18. Finally, a second structural layer 10 may be deposited on second undoped film 16 to produce the sandwich structure shown in FIG. 3.

The undoped films 14 and 16 essentially cap the dopants of the thin doped oxide layer 18 and constrain them to the center of the sacrificial film sandwich. Thus, the dopants are prevented from interacting with the structural layers 10 and 12 at any time, but still provide a fast etch channel. To remove the sacrificial layer, which in the present invention, is an ensemble of sandwiched layers 14, 18 and 16, an etchant such as HF is applied along etch fronts 20 and 22. During the release step, the etchant quickly dissolves the doped oxide layer 18 at the center of the sacrificial film sandwich, and then proceeds to dissolve the undoped films 14 and 16. Since these undoped films 14 and 16 are exposed to the etchant over a large area rather than over a small area, the etch time is reduced significantly when compared with a sacrificial film made exclusively of slow etching material, such as described with respect to FIG. 1. Indeed, as FIG. 1 illustrates, the etchant is only in contact with front 16 and 18 which represent the thickness of sacrificial layer 14. In contrary, in one embodiment of the present invention, shown in FIG. 3, the etchant is in contact with a larger surface of layers 14 and 16, through a canal previously occupied by the fast etched doped oxide layer 18.

Figure 4:
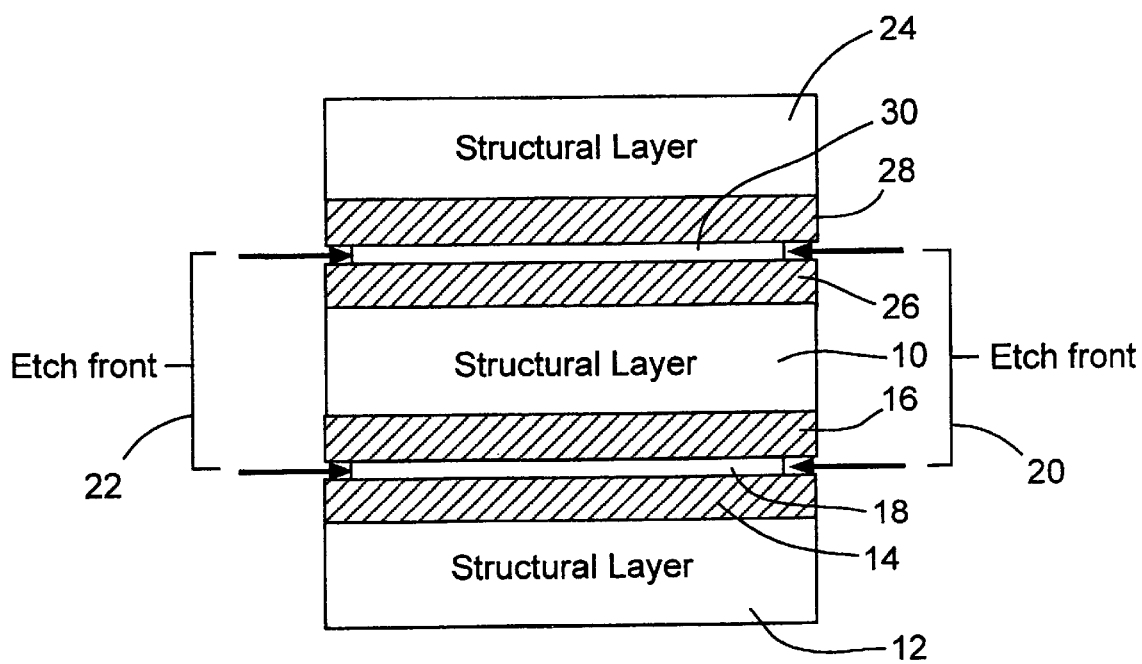
FIG. 4 is a schematic diagram illustrating the application of a release step according to an alternative embodiment of the invention.

In an alternative embodiment of the invention, a multi-layered structure is fabricated according to the method outlined previously. The structure formed by the steps in this embodiment is shown in FIG. 4. This layered structure shown in FIG. 4 represents a continuation of the steps, before applying an etchant, of the embodiment shown in FIG. 3. Indeed, those of skill in the art will appreciate that the method may readily be extended to the fabrication of multilayer structures that include more than two structural layers. For such applications, a sacrificial sandwich comprising a plurality of layers of undoped oxide around a layer of doped oxide is formed between every pair of structural layers. As shown in FIG. 4, a third layer 26 of an undoped oxide, such as tetraethylorthosilicate (TEOS), thermal oxide, low-temperature oxide (LTO), or plasma-enhanced chemical-vapor-deposition (PECVD) oxide, is deposited over structural layer 10. Doped oxide layer 30 is then deposited over undoped oxide layer 26. Examples of materials appropriate for the thin doped oxide layer 30 include, but not limited to, phosphosilicate glass (PSG), borosilicate glass (BSG), and borophosphosilicate glass (BPSG). Undoped oxide layer 28 is then deposited over the thin doped oxide layer 30. Finally, a third structural layer 24 may be deposited on undoped film 28 to produce the double sandwich structure shown in FIG. 4.

The sacrificial sandwiches comprised of layers 14–18–16 and 26–30–28 are then removed through application of an etchant along etch fronts 20 and 22. An advantage of the method of the invention in such applications is that the etchant may be applied only once.

Micromachined devices fabricated according to this method of the invention are suitable for numerous applications. One such application includes their use as micromirrors, in a wavelength router, such as described in detail in the co-pending, commonly assigned U.S. patent application, filed Nov. 16, 1999 and assigned Ser. No. 09/442,061, entitled "Wavelength Router," by Robert T. Weverka et al., which is herein incorporated by reference in its entirety, including the Appendix, for all purposes.

While a detailed description of presently preferred embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A method of fabricating a micromachined device, the method comprising:
   depositing a first undoped sacrificial layer over a first structural layer;
   depositing a doped sacrificial layer over the first undoped sacrificial layer;
   depositing a second undoped sacrificial layer over the doped sacrificial layer to produce a layered structure, wherein the doped sacrificial layer is thin compared with the first and second undoped sacrificial layers; and
   applying an etchant to the layered structure.

2. The method recited in claim 1 further comprising depositing a second structural layer over the second undoped sacrificial layer before applying the etchant.

3. The method recited in claim 2 further comprising, before applying the etchant:
   depositing a third undoped sacrificial layer over the second structural layer;
   depositing a second doped sacrificial layer over the third undoped sacrificial layer;
   depositing a fourth undoped sacrificial layer over the second doped sacrificial layer; and
   depositing a third structural layer over the fourth undoped sacrificial layer.

4. The method recited in claim 1 wherein the first undoped sacrificial layer and the second undoped sacrificial layer are formed of the same material.

5. The method recited in claim 1 wherein the first undoped sacrificial layer and the second undoped sacrificial layer are oxides.

6. The method recited in claim 5 wherein the first undoped sacrificial layer and the second undoped sacrificial layer are tetraethylorthosilicate.

7. The method recited in claim 5 wherein the first undoped sacrificial layer and the second undoped sacrificial layer are thermal oxide.

8. The method recited in claim 5 wherein the first undoped sacrificial layer and the second undoped sacrificial layer are low-temperature oxide.

9. The method recited in claim 5 wherein the first undoped sacrificial layer and the second undoped sacrificial layer are plasma-enhanced chemical-vapor-deposition oxide.

10. The method recited in claim 1 wherein the doped sacrificial layer comprises phosphosilicate glass.

11. The method recited in claim 1 wherein the doped sacrificial layer comprises borosilicate glass.

12. The method recited in claim 1 wherein the doped sacrificial layer comprises borophosphosilicate glass.

13. The method recited in claim 1 wherein the etchant comprises hydrofluoric acid.

14. The method recited in claim 1 wherein the first structural layer forms part of a micromirror.

15. The method recited in claim 1 wherein the micromachined device forms part of a wavelength router.

16. A micromachined device fabricated according to the method recited in claim 1.

17. A method for fabricating a micromachined device, the method comprising:
   depositing a first undoped oxide sacrificial layer over a first structural layer;
   depositing a doped oxide sacrificial layer over the first undoped oxide sacrificial layer;
   depositing a second undoped oxide sacrificial layer over the doped oxide sacrificial layer, wherein the doped oxide sacrificial layer is thin compared with the first and second undoped oxide sacrificial layers;
   depositing a second structural layer over the second undoped oxide sacrificial layer to produce a layered structure; and
   applying an etchant to the layered structure, the etchant comprising hydrofluoric acid.

* * * * *